(12) United States Patent
Widmer et al.

(10) Patent No.: US 6,483,285 B2
(45) Date of Patent: Nov. 19, 2002

(54) ELECTRICITY METER WITH AN ADDITIONAL COMPUTING MODULE

(75) Inventors: Jakob Widmer, Zug (CH); George Kostell, Rock Hill, SC (US)

(73) Assignee: Siemens Metering AG, Zurich (CH)

( * ) Notice: Subject to any disclaimer, the term of this patent is extended or adjusted under 35 U.S.C. 154(b) by 0 days.

(21) Appl. No.: 09/745,908

(22) Filed: Dec. 21, 2000

(65) Prior Publication Data

US 2001/0045821 A1 Nov. 29, 2001

(30) Foreign Application Priority Data

Dec. 22, 1999 (DE) .......................................... 19962435

(51) Int. Cl.[7] .............................................. G01Z 21/33
(52) U.S. Cl. ...................... 324/74; 324/142; 324/158.1
(58) Field of Search ................... 324/142, 127, 324/158.1, 74

(56) References Cited

U.S. PATENT DOCUMENTS

| | | | |
|---|---|---|---|
| 4,837,504 A | 6/1989 | Baer et al. | 324/142 |
| 5,715,390 A | 2/1998 | Hoffman et al. | 324/142 |
| 6,058,354 A | 5/2000 | Adame et al | 324/142 |
| 6,133,720 A | 10/2000 | Elmore | 324/142 |
| 6,275,021 B1 | 8/2001 | Windsheimer | 324/142 |

*Primary Examiner*—Michael Sherry
*Assistant Examiner*—Jimmy Nguyen
(74) *Attorney, Agent, or Firm*—Maginot, Moore & Bowman, LLP

(57) ABSTRACT

In order in a digital electricity meter (1) to permit flexibility in terms of user wishes, it is provided that, in addition to its basic meter (2) containing the basic metering functions, the electricity meter (1) includes an additional computing module (23) with which user-specific computations or functions can be implemented. In that way a virtual meter is formed within the electricity meter (1). Preferably the additional computing module (23) is accessible by way of an access module (20) and is freely programmable by the user without the calibrated function of the basic meter being violated.

11 Claims, 1 Drawing Sheet

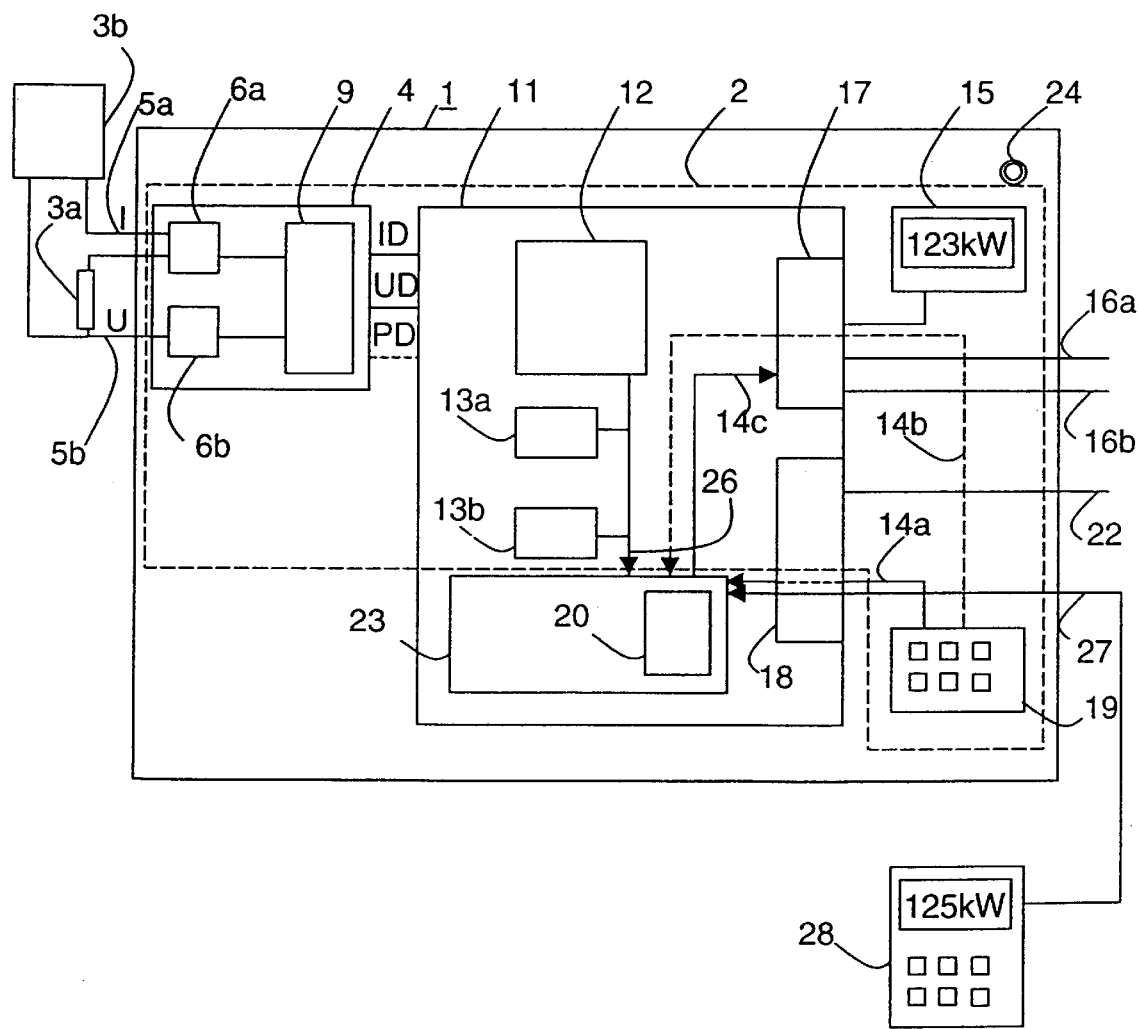

ELECTRICITY METER WITH AN ADDITIONAL COMPUTING MODULE

BACKGROUND OF THE INVENTION

1. Field of the Invention

The invention concerns an electricity meter having a basic meter which requires calibration.

2. Description of the Prior Art

DE 196 05 653 discloses a digital electricity meter to which signals from a consumer or a load can be fed by way of sensors for current and voltage. The detected signals are digitized by means of an A/D-converter and fed to a digital processing device. There, the most widely varying computation procedures, in particular the computation of energy or meter values, are then executed by means of various modules which are substantially in the form of software units. The most widely varying computation operations are possible for that purpose. Output or signaling of the items of information ascertained is then implemented by way of a display and/or an optical or an electrical interface. The interface, the display and a keyboard for the input of information are activated by way of a control device.

For accounting purposes an electricity meter of that kind must meet a calibration requirement and therefore has to be certified. For that purpose the casing or a region which is not accessible to the user, for example a space which can be closed by a flap, can usually be secured by a lead seal so that intervention in the meter and in particular in the measuring assembly thereof is thus made more difficult and can be monitored.

However there is often a need on the part of the users to expand or modify functions on the meter. That however is generally not possible without intervention in the meter, whereby the certification lapses. An exception is represented under some circumstances by modular meters which can be expanded with hardware modules without damaging the calibration seal. A meter with an additional module is known for example from DE 197 12 239 C1. The additional module in that case can also be provided with a lead seal. The reference book "Electrische Energie elektronisch gemessen", Dr.-Ing.Martin Kahmann, vde-Verlag GmbH, 1994, pages 154 through 158, also describes modularity in relation to meters.

SUMMARY OF THE INVENTION

The object of the present invention is to provide an electricity meter in which simple user-specific functional expansion is afforded without influencing its part which requires calibration.

In accordance with the invention, there is provided an electricity meter having a basic meter which requires calibration, including:
  a current sensor and a voltage sensor for detecting signals which represent the energy consumption at an electrical load,
  an analog/digital converter device connected downstream of the sensors, and
  a digital processing arrangement with at least one associated memory, a display and/or an input/output module, wherein the digital processing arrangement with a computing module on the basis of the detected signals ascertains the energy consumption at the load and outputs same by way of the display and/or the output module, wherein:
  there is provided an additional computing module which is not subject to the calibration requirement,
  wherein the computing module has reaction-free access to the signal and/or energy values ascertained and/or stored in the processing arrangement, and
  parameters calculated by the computing module can be outputted by way of the display and/or the input/output module and/or an additional output module.

The additional computing module may be used to implement computing operations in user-specific fashion on the basis of detected current and voltage values. That, as it were, provides an additional virtual meter within the meter. It is possible to make the functions which are accessible to the user, in particular a computing function, reaction-free in relation to the "basic meter", the so-called measuring arrangement, or the main functions of the meter.

That takes account of the needs of users to provide for additional functions or expansions without expansion of the electricity meter in terms of hardware or software. In that case the additional computing module can already be defined in a customer-specific fashion, depending on the respective customer wish, and thereby implemented in the meter, so that the desired functions or computations can be called up immediately.

Optionally, there can also be provided an access module, in particular an editor or an interpreter, so that the desired functions or computations can be defined or modified by the customer. The electricity meter thus becomes "freely programmable"for predeterminable functions or computations, without official authorization or certification of the actual meter being violated.

The input module advantageously has a multiplier connected upstream thereof, for the production of power values on the basis of the detected current and voltage signals. That reduces the computation expenditure in the processing arrangement, while faster data processing is afforded when the multiplier is in the form of hardware multiplier. The access module can thus also have recourse to the outputted power values.

It is desirable if the digital processing arrangement includes at least one computer. It is alternatively also possible to envisage a dual- or multi-computer arrangement, in which case provision is made for task distribution to the individual computers. Specifically in that case the input/output module and possibly the display and further interfaces and the keyboard can be controlled by a common computer. Depending on the task involved, in the context of the present digital data processing procedures, the computer used can be a microprocessor, a controller and/or a digital signal processor.

Preferably the access module is accessible to a user by way of a keyboard or by way of an interface and an external input unit. For example the meter-specific keyboard can be used as the keyboard. That means that the access module can be operated in a simple manner like a programmable pocket calculator. In regard to access by way of an interface, it is possible for the external input unit to be formed by an external keyboard or also by a PC, terminal or small computer. In that way even complicated computing operations or fimctions can possibly be inputted.

The forms or instructions produced with the access module in the additional computing module can advantageously be stored. That permits permanent recourse to the inputs. In this respect, the storage space provided for that purpose can be made available by a separate memory or can be a part of a memory of the processing arrangement. Storage separation is not absolutely necessary but it can be desirable in individual cases or in relation to specific uses, in particular in regard to freedom from reaction.

The current and voltage sensors are advantageously of a single-phase or three-phase nature so that adaptation to any kinds of mains network is possible. Preferably the basic meter is associated with a region of first access priority and the additional computing module is associated with a region of second access priority. In this respect, the region of first access priority has means for fitting a seal. That means that the electricity meter can be realized in terms of its basic functions in accordance with the requirement for calibration.

The region of second access priority possibly has means for querying an access authorization. In that way this influenceable region can also be protected from manipulation. In the simplest case the querying means can be embodied by a safeguard means, in particular a lead seal. Further possible forms are for example a key or cipher query or a query by way of a keyword by means of the keyboard.

BRIEF DESCRIPTION OF THE DRAWING

Further advantages and details of the invention are described more fully hereinafter with reference to a preferred embodiment. The FIGURE shows a block circuit diagram for the hardware of an electricity meter. In this respect the most widely varying functions, units, hardware and software are shown in mixed form, with the transitions between hardware and software possibly being fluid.

DESCRIPTION OF THE PREFERRED EMBODIMENT

The single FIGURE shows an electricity meter 1 with a basic meter 2. The basic meter 2 has in principle all functions and means for detecting the electrical energy consumption of a consumer or a load 3a which is connected to an electrical mains network 3b.

To acquire the required current and voltage signals I and U respectively at the load 3a, the arrangement firstly has an input module 4 whose inputs 5a, 5b are connected to a current and a voltage sensor 6a, 6b respectively. The current and voltage sensors 6a, 6b are followed by an analog/digital converter device 9. That therefore virtually forms the so-called "front end" of the basic meter 2. The digitized values UD and ID of the supplied current and voltage values are symbolically indicated at the output of the input module 4. In that respect transfer of the values can be effected serially or in parallel. It will be appreciated that the input module 4 may be of a three-phase nature or may also be provided in a multiple configuration so that it is possible to detect the energy consumption at three-phase consumers. Converters or galvanic separating in accordance with the state of the art can also be connected at the upstream side of the meter 1 or the input module 4.

The sensors 6a, 6b of the input module 4 can be of any desired configuration in accordance with the state of the art. In particular a structure involving a voltage divider or a voltage transformer is used for voltage detection. The current sensor 6a can be formed for example by a Hall element or a conventional current transformer with coil. A structure with a shunt is also possible. A connection of the current and voltage path formed in that way by a common Hall element is optionally also possible, whereby at the same time formation of power values is possible, by the multiplying effect of the Hall element. By way of example, illustrated in that respect at the output of the input module 4 is the digitized power value PD.

It will be appreciated that further circuitry details, for example the use of multiplexers for forming the multi-phase configuration, are also possible within the input module 4. Preferably a sigma-delta converter is used for the analog/digital converter device 9. It is optionally also possible to use a plurality of signal converters for forming a multi-channel converter device. An additional multiplier can also be used for formation of a power or energy value within the input module 4.

Accordingly the digitized values ID, UD of current I and voltage U and possibly also a power or energy value PD occur at the output of the input module 4 for transfer to a digital processing arrangement 11. The digital processing arrangement 11 has as its central component a computer 12 which for example can be in the form of a microprocessor or a digital signal processor. It serves essentially for processing the signal values supplied by the input module 4.

Associated with the computer 12 is at least one memory 13a and optionally also a further memory 13b. The memory 13a is preferably in the form of a ROM and essentially holds the operating program and other software for the computer 12. The memory 13b can be in the form of a RAM so that data or values from the computer 12 can be held in intermediate storage here. On the basis of stored formulae, procedures or routines the computer 12 ascertains the desired energy values and transmits them to an input/output module 17.

The input/output module 17 serves for actuation of a display 15 and further interfaces 16a and 16b which for example can be in the form of optical or electrical interfaces. Accordingly, output of the ascertained energy values and communication with the electricity meter 1 is possible by way of the input/output module 17 and the means connected downstream thereof. In addition the arrangement may optionally have an input module 18 which serves as a communication interface for items of information which are to be inputted. For example, a keyboard or keypad 19 (by way of line 14a) and possibly a further interface 22 can be connected, by way of the input module 18, for the input of items of information. Preferably the input module 18 serves only for access to the access module 20 or the additional computing module 23.

The input/output module 17 and the input module 18 can possibly have a common computer, microprocessor or controller. It will be appreciated that suitable conventional hardware means, for example optocouplers, coupling elements, current supply means and so forth are to be provided for executing the respective functions involved. In the simplest case, control or implementation of the input/output module 17 and the input module 18 can also be effected by the computer 12.

Those elements, units, modules and functions describe the basic functions of the basic meter 2, in accordance with the state of the art. That basic meter 2 forms optionally with its housing (not shown) a first access region which is subject to the calibration requirement. Symbolically illustrated in that respect on the basic meter 2 is an eye 24 for fitting a lead seal. The basic meter 2 is thus sealed so that any intervention in relation to its parts which are functionally essential can be checked.

In accordance with the new idea herein the processing arrangement 11 has an additional computing module 23. The additional computing module 23 is substantially in the form of a program and can therefore preferably be executed by the computer 12 of the processing arrangement 11. As a time-critical function is not involved here, it is also possible for that function to be executed by another computer within the processing arrangement 11, for example by the computer of the input/output module 17.

The aim and purpose of the additional computing module 23 is that additional functions or computations can be executed and possibly inputted or programmed by the user without in any way influencing the functions of the basic meter 2, whereby a "special meter" with user-specific functions is embodied within a meter. For that purpose it is firstly necessary for any data of the processing arrangement 11 to be available for the additional computing module 23. That is indicated by the operative connecting line 26. It is essential in this respect that there is a freedom from reaction when accessing the data, as is, required for the basic meter 2 to function. For that purpose therefore a so-called "firewall" is interposed between the basic meter function and the computing module function. In a basic configuration, the electricity meter 1 can be equipped with a fixedly predetermined number of additional functions which are available for the user.

The additional computing module 23 optionally has an access module 20 in the sense of an editor or interpreter with which the additional functions can be activated or modified. The access module 20 essentially serves to predetermine or activate formulae or processing steps in the additional computing module 23, which implement computations or functions on the basis of the accessible data. For that purpose the additional computing module 23 may either include its own memory (not shown) or possibly a memory region which is allocated by the memories 13a and 13b, for program access and for the storage of items of information. Essentially for that purpose it is necessary to have an associated storage region for the storage of inputted formulae or processing steps. For the transfer of data or values there can possibly be provided a neutral transfer memory region by which the "firewall" is formed.

Manual input of the formulae and the processing steps is preferably effected by way of the keyboard 19 which communicates with the additional computing module 23 by way of the operative lines 14b or 14a by way of the input/output module 17 or the input module 18. The additional computing module 23 is associated in relation to the basic meter 2 with a region of second access authorization. In the simplest case therefore the access module 20 can be freely accessible. If access restrictions are to be provided here, means can be provided for enabling or querying the authorization. It is possible for that purpose for example for the keyboard 19 to be accessible by way of a key or cipher function. That function can be embodied for example by a hardware key or a key query in the form of keyword which is inputted by way of the keyboard.

It will be appreciated that it is also possible to provide an additional internal or external keyboard. The simplest embodiment provides that essentially all hardware elements of the basic meter 2, in particular the keyboard 19 and the display 15, can be used for the execution of additional functions. The access module 20 is alternatively or additionally also accessible by way of an optional interface 27 by means of an external input unit 28. In that respect the external input unit 28 can be in the form of a conventional PC or other handheld terminal or keyboard or keypad with display.

What is important for the new function is that an additional meter or a so-called "virtual meter" which can be defined specifically according to the user is formed by means of the computing module 23 within the electricity meter 1, in particular within its housing. For that purpose for example it is possible by means of the access module 20 to ascertain special energy values, for example "five and a half hour values", or when energy values are exceeded, or to be able to input mains network failure monitoring procedures, current limit value monitoring procedures or monitoring procedures in respect of attempts at theft, or also special formulae for calculation of a special energy value. It is also possible to produce redundant functions, for example calculation of a value in accordance with an alternative formula. In that respect the virtual meter is not embraced by the calibration regulation pertaining to the basic meter.

In this respect the access module 20 may also embrace a number of fixed basic functions in the manner of a library, which can be activated or loaded. This can involve for example standard formulae or limit value functions, in which case the additional functions to be set up are then produced on the basis of those "building blocks". Loading or production of the "virtual meter function" can possibly be implemented by way of the interfaces 22 or 27 so that an external access module, for example with the input unit 28, is used.

The basic prerequisite for the new function is that the function of the virtual meter is without reaction on all functions of the basic meter 2. That means for example that, when using the same memories and the same computer within the processing arrangement 11, the computations of the basic meter 2 have priority and may not be influenced in any way. The basic meter 2 always has priority, in the event of conflict situations in regard to processing steps.

The additional virtual meter also affords quasi a test field for the user, in which respect it is possible to produce additional functions themselves without the need to provide a special meter or additional items of equipment. Use of a meter of that kind can be envisaged in particular in regard to industrial users in respect of which additional functions are wanted in-house. Furthermore a meter of that kind can also be used as an "experimental or test meter" in trial or testing operations. Alternatively however it is also possible to envisage use in the domestic sector in which a customer, on the basis of his own settings, wants to register monitoring and corresponding evaluations of his energy consumption.

We claim:

1. An electricity meter having a basic meter which requires calibration, including:
    a current sensor and a voltage sensor for detecting signals which represent the energy consumption at an electrical load,
    an analog/digital converter device connected downstream of the sensors, and
    a digital processing arrangement with at least one associated memory, a display and/or an input/output module, wherein the digital processing arrangement with a computing module on the basis of the detected signals ascertains the energy consumption at the load and outputs same by way of the display and/or the output module,
    wherein:
        there is provided an additional computing module which is not subject to the calibration requirement,
        wherein the computing module has reaction-free access to the signal and/or energy values ascertained and/or stored in the processing arrangement, and
        parameters calculated by the computing module can be outputted by way of the display and/or the input/output module and/or an additional output module.

2. An electricity meter as set forth in claim 1, wherein the input module includes a multiplier for producing power values on the basis of the detected current and voltage signals.

3. An electricity meter as set forth in claim 1, wherein the digital processing arrangement includes at least one computer.

4. An electricity meter as set forth in claim 1, wherein associated with the computing module is an access module which serves for presetting or activating instructions for computation of parameters to be ascertained on the basis of the signal or energy values in the computing module.

5. An electricity meter as set forth in claim 4, wherein the access module is accessible to a user by way of the keyboard or by way of an interface with an external input unit.

6. An electricity meter as set forth in claim 4, wherein instructions or formulae produced with the access module can be stored.

7. An electricity meter as set forth in claim 4, wherein the basic meter is associated with a region of first access priority and the access module is associated with a region of second access priority.

8. An electricity meter as set forth in claim 7, wherein the basic meter has means for fitting a lead seal for forming its access priority.

9. An electricity meter as set forth in claim 7, wherein the region of second access priority has means for querying an access authorization.

10. An electricity meter as set forth in claim 1, wherein the current and voltage sensors are of a single-phase or three-phase nature.

11. An electricity meter as set forth in claim 1, wherein the input/output module is controlled by a controller or microprocessor.

* * * * *